(12) United States Patent
Loughmiller

(10) Patent No.: US 6,847,534 B2
(45) Date of Patent: Jan. 25, 2005

(54) HIGH DENSITY DYNAMIC TERNARY-CAM MEMORY ARCHITECTURE

(75) Inventor: Daniel R. Loughmiller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/833,306

(22) Filed: Apr. 28, 2004

(65) Prior Publication Data

US 2004/0196701 A1 Oct. 7, 2004

Related U.S. Application Data

(63) Continuation of application No. 10/224,452, filed on Aug. 21, 2002, now Pat. No. 6,744,654.

(51) Int. Cl.[7] .............................................. G11C 15/04
(52) U.S. Cl. ...................... 365/49; 365/149; 365/189.07
(58) Field of Search ...................... 365/49, 149, 189.07

(56) References Cited

U.S. PATENT DOCUMENTS

| | | | |
|---|---|---|---|
| 5,319,589 A | 6/1994 | Yamagata et al. | |
| 5,949,696 A | 9/1999 | Threewitt | |
| 6,256,216 B1 | 7/2001 | Lien et al. | |
| 6,259,280 B1 | 7/2001 | Koelling | |
| 6,266,263 B1 | 7/2001 | Lien et al. | |
| 6,310,880 B1 | 10/2001 | Waller | |
| 6,320,777 B1 | 11/2001 | Lines et al. | |
| 6,362,992 B1 | 3/2002 | Cheng | |
| 6,373,739 B1 | 4/2002 | Lien et al. | |
| 6,421,265 B1 * | 7/2002 | Lien et al. | 365/49 |
| 6,430,169 B1 | 8/2002 | Harms et al. | |
| 6,430,170 B1 | 8/2002 | Saints et al. | |
| 6,430,414 B1 | 8/2002 | Sorokine et al. | |
| 6,430,415 B1 | 8/2002 | Agashe et al. | |
| 6,483,733 B2 * | 11/2002 | Lines et al. | 365/49 |
| 6,512,685 B1 | 1/2003 | Lien et al. | |
| 6,529,397 B2 * | 3/2003 | Takeda et al. | 365/63 |
| 6,584,003 B1 | 6/2003 | Kim et al. | |
| 6,754,093 B2 * | 6/2004 | Lien | 365/49 |

* cited by examiner

*Primary Examiner*—Son Mai
(74) *Attorney, Agent, or Firm*—Dickstein Shapiro Morin & Oshinsky, LLP

(57) ABSTRACT

A ternary CAM memory device is disclosed which comprises a pair of complementary compare lines, a pair of complementary bit lines, and a unique four transistor two capacitor circuit.

10 Claims, 5 Drawing Sheets

| COMPARAND | 0 | 1 | 1 | |
|---|---|---|---|---|
| CAM WORD 0 | 0 | 1 | X | MATCH |
| CAM WORD 1 | X | 0 | 0 | NO MATCH |
| CAM WORD 2 | 1 | 0 | 1 | NO MATCH |

HIGH DENSITY DYNAMIC TERNARY-CAM MEMORY ARCHITECTURE

This application is a continuation of U.S. patent application Ser. No. 10/224,452, filed Aug. 21, 2002 now U.S. Pat. No. 6,744,654.

FIELD OF THE INVENTION

The invention relates generally to a semiconductor memory and more particularly to a DRAM CAM device that performs compare operations simultaneously with refresh operations.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices. For example, data is stored in a random access memory (RAM) in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location. Once information is stored in a memory location, it is found doing a memory search by comparing every bit in any memory location with every bit of data in a comparand register circuit. When the content stored in the CAM memory location does not match the data placed in the comparand register, the CAM device returns a no match indication. When the content stored in the CAM memory location matches the data placed in the comparand register, the CAM device returns a match indication. In addition, the CAM returns the identification of the address location in which the matching data is stored. Thus, with a CAM, the user supplies the data and gets back an indication of an address where a matching data is stored in the memory.

Locally, CAMs perform an exclusive-NOR (XNOR) function, so that a match is indicated only if both the stored bit and the corresponding input bit are the same state. CAMs are designed so that any number or all of the memory locations may be simultaneously searched for a match with incoming data. In certain cases, data in more than a single location in the memory will match the input data, This condition of multiple simultaneous matches must be detected and reported. However, circuitry for detecting multiple matches in a CAM memory generally is large and complex, and grows exponentially with the number of data words in the memory. Also, switching time is impeded because of the parasitic capacitance associated with the complex logic. Thus, there is a need for a multiple match detector having increased switching speed, yet reduced circuit complexity.

BRIEF SUMMARY OF THE INVENTION

In one aspect, the invention provides a simplified DRAM CAM device having a pair of content capacitors for storing data corresponding to a ternary value of the memory cell; a pair of pass transistors each separately connected to one of the content capacitors and also connected to one of a pair of complementary bitlines, for reading, writing, and refreshing the memory cell; and a pair of logic transistors each separately connected to one of the complementary compare lines and one of the capacitors for performing a comparison of the data on the complementary compare lines with that on the capacitors.

In yet another aspect of the invention, the content capacitors are transistors configured as capacitors.

These and other features and advantages of the invention will be more clearly seen from the following detailed description of the invention which is provided in connection with the accompanying drawings.

BRIEF DESCRIPTION OF THE DRAWINGS

FIG. 4 is table of outputs resulting from a comparison made using the CAM memory device of the present invention.

DETAILED DESCRIPTION OF THE INVENTION

Figure 1:
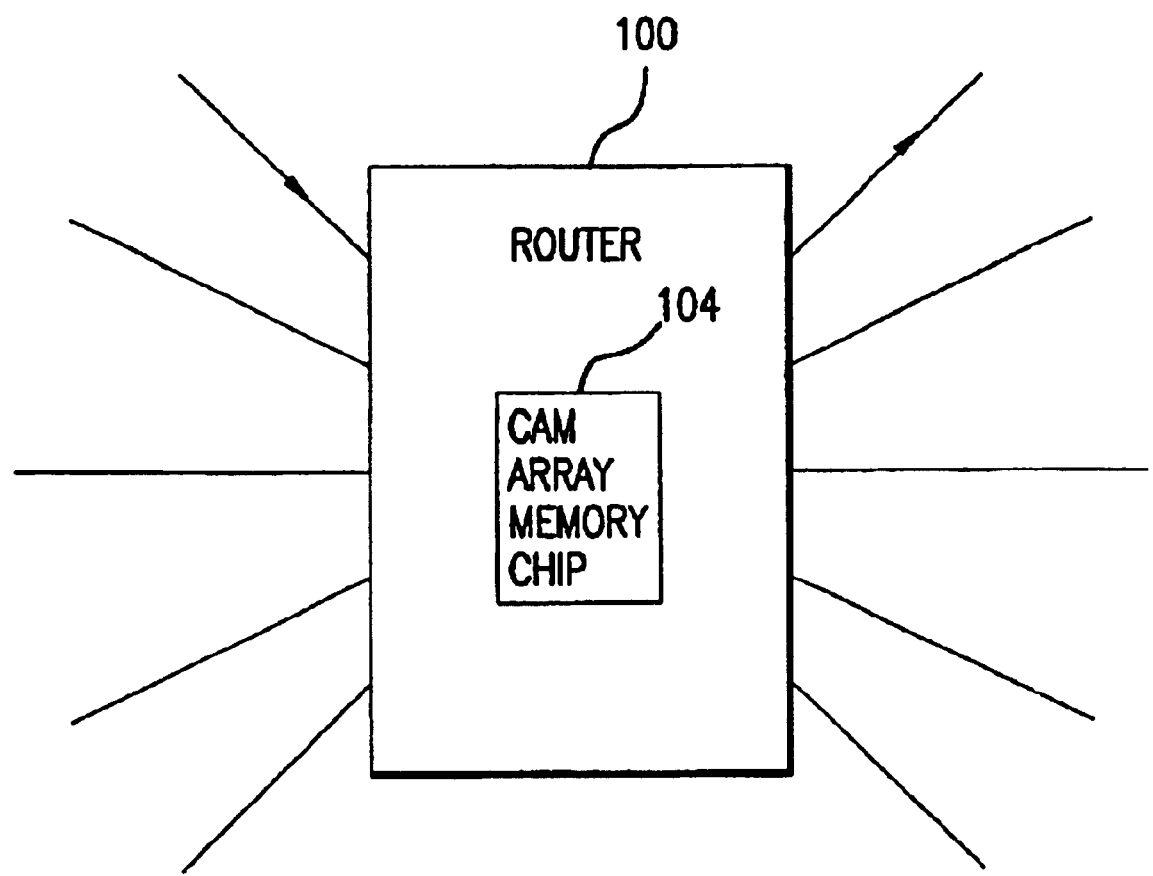
FIG. 1 is a block diagram of a CAM router.

FIG. 1 is a simplified block diagram of a router 100 containing a CAM array memory chip 104 as may be used in a communications network, such as, e.g., part of the Internet backbone. The router 100 contains a plurality of input lines and a plurality of output lines. When data is transmitted from one location to another, it is sent as a packet. Oftentimes, prior to the packet reaching its final destination, that packet is first received by a router, or some other device. The router 100 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Every dataword in a CAM has associated therewith a digital comparator which compares the data stored in that word with the data present at the input to the CAM, also known as a comparand. When the two words match, a match flag is generated. Conversely, the match signal is not generated in the absence of a match.

Figure 2:
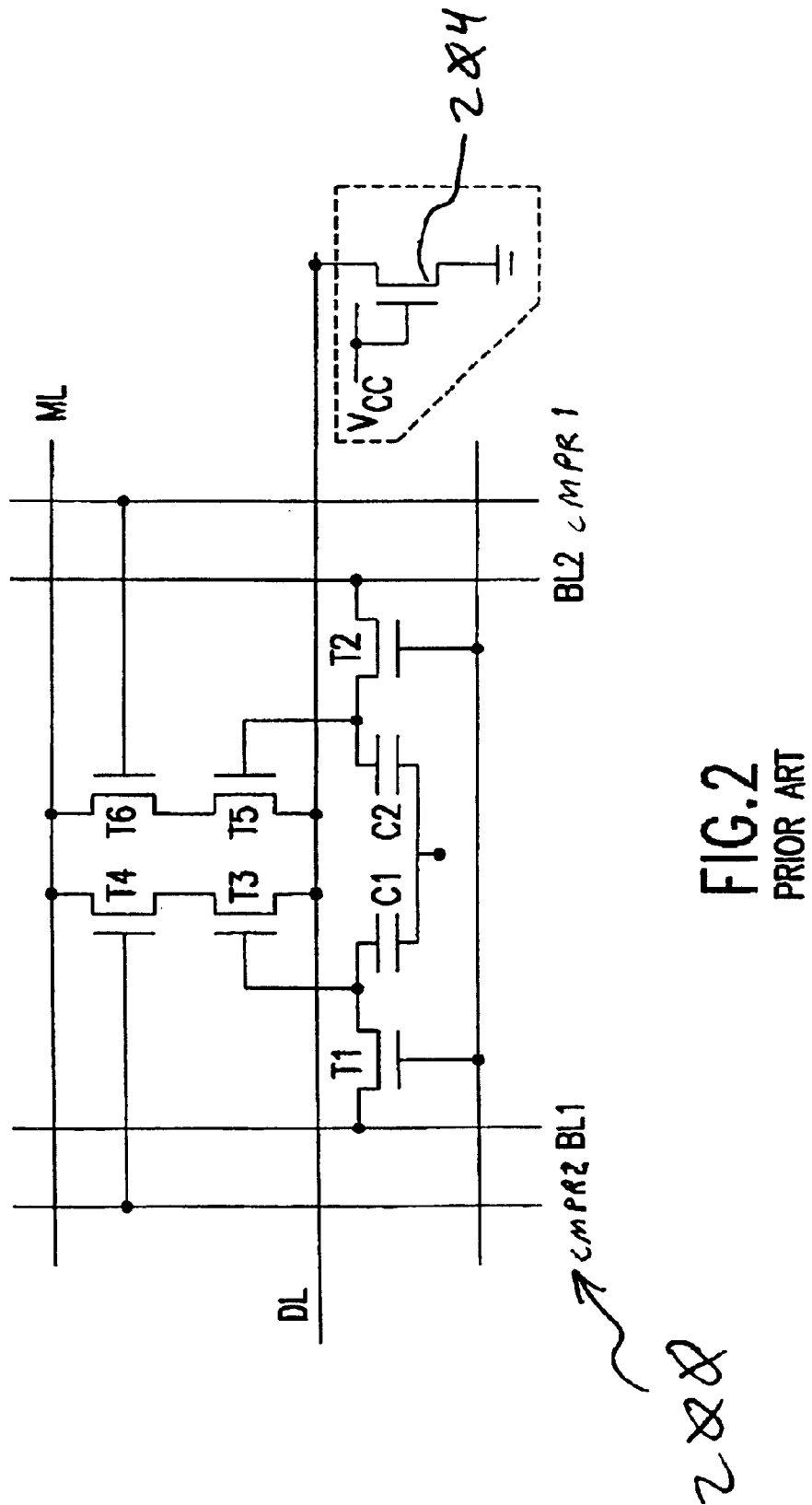
FIG. 2 is a schematic diagram of a prior art CAM memory cell.

As shown in FIG. 2, prior art DRAM based CAMs utilize a six transistor (T1–T6), two capacitor (C1–C2) per memory cell 200 arrangement. The prior art memory cell 200 has dual complementary bitlines BL1, BL2 and compare lines CMPR1, CMPR2. A discharge line DL is necessary for periodically discharging the match line ML through either of the serially connected transistors T3, T4 or T5, T6. To prevent a possible false route to ground, a ground line transistor 204 is connected to the discharge line DL.

Figure 3:
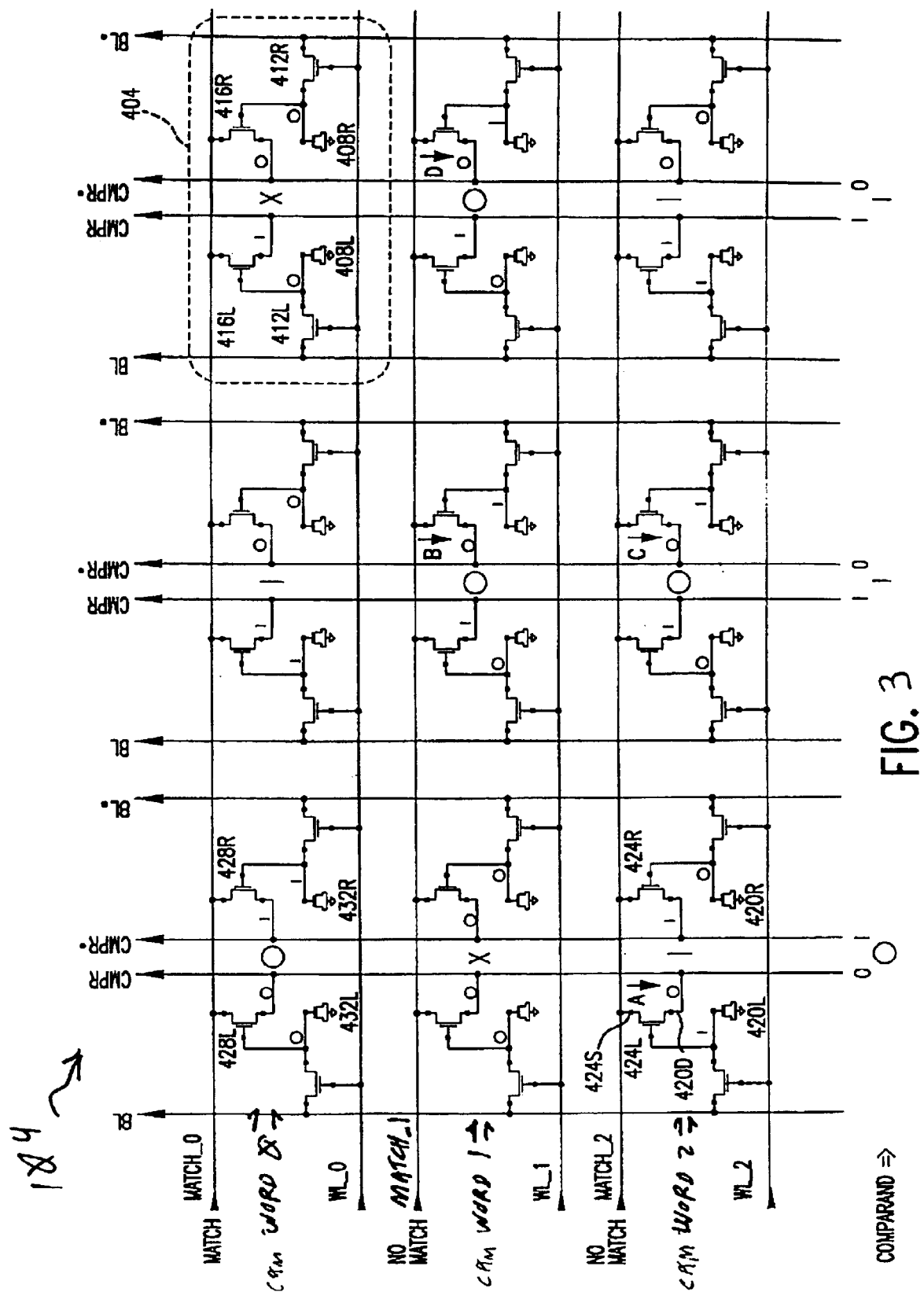
FIG. 3 is a schematic diagram of an array of CAM memory cells of the present invention.

The present invention, conversely, employs only four transistors and two capacitors, as shown by the example memory cell 404 in the portion of a CAM array depicted in FIG. 3. No discharge line or ground line transistor is necessary as the compare (CMPR and CMPR*) lines are used to discharge the match lines MATCH_0, MATCH_1, and MATCH_2.

FIG. 3 shows a total of nine individual CAM cells in the illustrated portion of the CAM memory array 104. Using the unit cell 404 as an example, FIG. 4 shows that each individual cell of the memory array 104 has two capacitors 408L, 408R, two pass transistors 412L, 412R, and two logic transistors 416L, 416R Each memory cell holds one binary bit of data, where that bit is stored in complementary fashion within the two content capacitors 408L, 408R The content capacitors 408L, 408R are drawn as transistors behaving as capacitors, although traditional capacitors could be used as well. If the content capacitors 408L, 408R hold a '0' and '1', respectively, the memory cell 404 holds a binary '0'. Similarly, if the content capacitors 408L, 408R hold a '1' and '0' respectively, the memory cell 404 holds a binary '1'. Finally, if the content capacitors 408L, 408R both store a '0', the memory cell 404 holds a value of 'Don't Care'. A situation where both content capacitors 408L, 408R are simultaneously fully charged is not desired nor required to practice the present invention.

FIG. 4 is a table illustrating an exemplary set of comparison results using a ternary CAM device, which can store either 0's, 1's, or X's (Don't Cares). In FIG. 4, the values of the 3-bit CAM words 0, 1, and 2 are the same values which can be stored in the memory cells of FIG. 3. For brevity, the memory words in the example illustrated in FIG. 4 are 3 bits in length, although the present invention is not limited thereto. To perform a CAM lookup, the data to be compared (the comparand) is delivered to the CAM device. A bitwise comparison is then performed and if a match is found on all bits, a "match" signal is asserted. As shown in FIG. 4, memory word 1 fails to result in a match because its second and third bits do not match with the comparand's second and third bits. Similarly, memory word 2 fails to result in a match because its first and second bits do not match with the comparand's first and second bits. Memory word 0 results in a match because its first and second bits match with the comparand's first and second bits. It is significant that a match still occurs even though the third bit of memory word 0 is a Don't Care.

Returning to FIG. 3, the two pass transistors 412L, 412R are used to read, write, and refresh the memory cell 404, and are respectively connected between the capacitors 408L and 408R and the bit lines BI, BL* and the sets of transistors 408L and 408R are controlled by a word line WL_0. The two logic transistors 416L, 416R are used to logically compare the contents of the memory cell with data on the compare lines CMPR and CMPR*. The gates of transistor 416L, 416R are respectively connected to the capacitors 408L and 408R while the source/drain regions of each are coupled between the match line MATCH_0 and a respective one of the compare lines CMPR, CMPR*.

When a compare operation is being performed, the value contained within each bit of the comparand (shown at the bottom of FIG. 3) is sent along the pair of complementary compare lines CMPR/CMPR*. As can be seen from the bottom of FIG. 3, for binary '0' the compare lines CMPR/CMPR* are set to 0/1, while for binary '1' are set to 1/0. The contents of the compare lines (1, 0, or 0, 1) are shown in each memory cell in a smaller font, while the larger font in the middle of the memory cell shows the actual contents of this memory cell itself (1, 0, X (don't care)). An active-high match line MATCH_0, MATCH_1, MATCH_2 for each of the CAM words 0 (top), 1 (middle), and 2 (bottom) is precharged to Vcc. If a set of logic transistors, e.g. 416L, 416R connected to compare lines CMPR/CMPR* detects a non-match between the comparand and one bit of the CAM data word, meaning that one of the channel transistors 416L, 416R has a positive voltage on its gate, i.e., a "1" logic value and a "0" logic value as its associated compare line CMPR/CMPR*, a conduction path will exist for current to travel from the match lines, e.g., MATCH_0 to ground through one of the transistors 416L, 416R and associated compare line as shown by the arrows A, B, C, and D (FIG. 3), so that the match line associated with that CAM word will be pulled to ground and no longer precharged to Vcc. This indicates a no match condition. However, if all bits of a CAM word match the comparand, no conduction path exists and the match line remains at Vcc indicating a match condition.

Using the leftmost bit of the CAM word 2 (bottom of FIG. 3) as an example, the comparand holds a '0' in its leftmost bit. The leftmost bit of the stored word 2 is a '1'. Therefore, a mismatch exists and the MATCH_2 line is pulled to ground by transistor 424L turning on. If a '1' appeared at the leftmost CMPR line connected to the drain of the transistor 424L, the transistor 424L would remain off and the match line would remain in a high, "1", state.

Each bit of a data word stored in the CAM memory array is thus compared with a bit on a respective compare line. If there is a data mismatch, one of the transistors e.g. 416L, 416R of a bit will have a "1" at its gate and a "0" at its compare line thus pulling the match line to ground. Thus, if any one of the bits of the stored word does not match the bit on the corresponding compare line, a data mismatch is indicated for the entire word. The data stored in the CAM memory cells is loaded by turning on the access transistors e.g. 412L, 412R with the associated word line, e.g. WL_0, while supplying the data to be stored to the cell bit lines BL, BL*.

Because separate complementary bitlines (BL and BL*) and compare lines (CMPR/CMPR*) are used, stored data within capacitor 408L, 408R can be read out by the bit lines BL, BL*, by turning on the access transistors 412L, 412R with the associated word lines. Since separate compare and bit lines are provided, simultaneous refresh and compare operations can occur.

Figure 5:
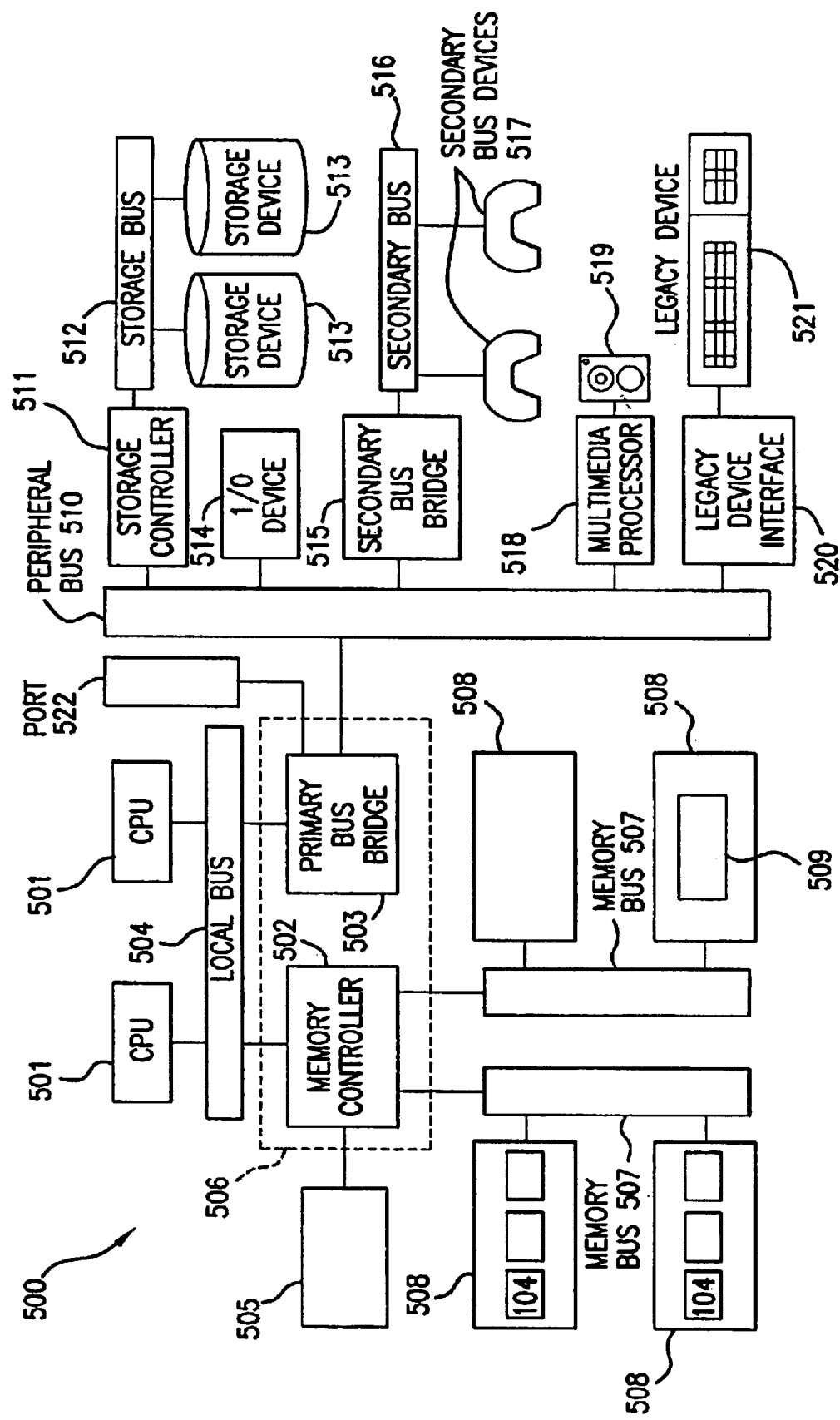
FIG. 5 is a schematic diagram of the present invention employed within a processor circuit.

FIG. 5 illustrates an exemplary processing system 500 which utilizes a CAM memory device 104 of the present invention. The processing system 500 includes one or more processors 501 coupled to a local bus 504. A memory controller 502 and a primary bus bridge 503 are also coupled the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508. Any one or all of memory components 508 may contain a CAM array 104 in accordance with the present invention.

The memory components 508 may be a memory card or a memory module. The memory components 508 may include one or more additional devices 509. For example, in a SIMM or DIMM, the additional device 509 might be a configuration memory, such as a serial presence detect (SPD) memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 include peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, an miscellaneous I/O device 514, a secondary bus bridge 515, a multimedia processor 518, and an legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be an local area network interface, such as an Ethernet card. The secondary bus bridge may be used to interface additional devices via another bus to the processing system. For example, the secondary bus bridge may be an universal serial port (USB) controller used to couple USB devices 517 via to the processing system 500. The multimedia processor 518 may be a sound card, a video capture card, or any other type of media interface, which may also be coupled to one additional devices such as speakers 519. The legacy device interface 520 is used to couple legacy devices, for example, older styled keyboards and mice, to the processing system 500.

The processing system 500 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory devices 509. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. For example, although dynamic CAM storage elements have been described as capacitors or as transistors functioning as capacitors, the invention can also be used with static storage elements for storing CAM data words. Accordingly, the invention is not to be considered as limited by the foregoing description but is only limited by the scope of the appended claims.

What is claimed as new and desired to be protected by Letters Patent of the United States is:

1. A method of producing a CAM cell, comprising:
   forming a bit line, compare line, and match line over a substrate;
   forming a first and second switch;
   forming a storage area; and
   electrically coupling said bit line to one of a source/drain area of said first switch, the other source/drain area of said first switch to said storage area, said compare line to one of a source/drain area of said second switch, the other source/drain area of said second switch to said match line, and the gate of said second switch to said storage area.

2. The method of claim 1 further comprising forming a word line, and electrically coupling a gate of said first switch to said word line.

3. The method of claim 1, wherein said forming a storage area comprises forming a capacitor.

4. The method of claim 1, wherein said forming a storage area comprises forming a transistor.

5. The method of claim 1, further comprising:
   forming over said substrate a second bit line which is complementary to said bit line, and a second compare line which is complementary to said compare line;
   forming a third and fourth switch;
   forming a second storage area; and
   electrically coupling said second bit line to one of a source/drain area of said third switch, the other source/drain area of said third switch to said second storage area, said second compare line to one of a source/drain area of said fourth switch, the other source/drain area of said fourth switch to said match line, and the gate of said fourth switch to said second storage area.

6. A method of producing a CAM device, comprising:
   forming a plurality of CAM cells, where forming one of said plurality of CAM cells comprises:
     forming a first bit line, first compare line, and match line over a substrate;
     forming a first storage area;
     forming a first and second switch; and
     electrically coupling said first bit line to one of a source/drain area of said first switch, the other source/drain area of said first switch to said first storage area, said first compare line to one of a source/drain area of said second switch, the other source/drain area of said second switch to said match line, and the gate of said second switch to said first storage area.

7. The method of claim 6 further comprising forming a word line, where a gate of said first switch is electrically coupled to said word line.

8. The method of claim 6, wherein said forming a storage area comprises forming a capacitor.

9. The method of claim 6, wherein said forming a storage area comprises forming a transistor.

10. The method of claim 6, wherein said method of forming a CAM cell further comprises:
    forming over said substrate a second bit line which is a complement to said first bit line and a second compare line which is a complement to said first compare line;
    forming a third and fourth switch;
    forming a second storage area; and
    electrically coupling said second bit line to one of a source/drain area of said third switch, the other source/drain area of said third switch to said second storage area, said second compare line to one of a source/drain area of said fourth switch, the other source/drain area of said fourth switch to said match line, the gate of said fourth sixth to said second storage area.

* * * * *

UNITED STATES PATENT AND TRADEMARK OFFICE
CERTIFICATE OF CORRECTION

PATENT NO. : 6,847,534 B2
DATED : January 25, 2005
INVENTOR(S) : Daniel R. Loughmiller It is certified that error appears in the above-identified patent and that said Letters Patent is hereby corrected as shown below:

Column 5,
Lines 6, 8, 19 and 23, "an" should read -- a --.
Line 27, "one additional" should read -- one of such additional --.
Line 27, "such as" should read -- as --.

Signed and Sealed this

Tenth Day of May, 2005

JON W. DUDAS
*Director of the United States Patent and Trademark Office*